United States Patent
Ji et al.

(10) Patent No.: US 11,181,586 B2
(45) Date of Patent: Nov. 23, 2021

(54) MODEL-BASED CAPACITY AND RESISTANCE CORRECTION FOR RECHARGEABLE BATTERY FUEL GAUGING

(71) Applicant: Medtronic, Inc., Minneapolis, MN (US)

(72) Inventors: Gang Ji, Medina, MN (US); Craig L. Schmidt, Eagan, MN (US); Gaurav Jain, Edina, MN (US)

(73) Assignee: Medtronic, Inc., Minneapolis, MN (US)

( * ) Notice: Subject to any disclaimer, the term of this patent is extended or adjusted under 35 U.S.C. 154(b) by 56 days.

(21) Appl. No.: 16/743,769

(22) Filed: Jan. 15, 2020

(65) Prior Publication Data

US 2021/0215766 A1 Jul. 15, 2021

(51) Int. Cl.
  *G01R 31/389* (2019.01)
  *G01R 31/392* (2019.01)
  *G01R 31/367* (2019.01)
  *G01R 31/36* (2020.01)

(52) U.S. Cl.
  CPC ......... *G01R 31/389* (2019.01); *G01R 31/367* (2019.01); *G01R 31/3648* (2013.01); *G01R 31/392* (2019.01)

(58) Field of Classification Search
  None
  See application file for complete search history.

(56) References Cited

U.S. PATENT DOCUMENTS

| | | |
|---|---|---|
| 5,514,946 A | 5/1996 | Lin et al. |
| 6,630,814 B2 | 10/2003 | Ptasinski et al. |
| 7,107,160 B2 | 9/2006 | Bean |
| 8,450,978 B2 | 5/2013 | Barsukov et al. |
| 8,643,331 B1 | 2/2014 | Wortham et al. |
| 2009/0273349 A1 | 11/2009 | Rondoni et al. |
| 2010/0010559 A1* | 1/2010 | Zhang .................. A61N 1/3708 607/27 |
| 2011/0187329 A1 | 8/2011 | Yoshihide |
| 2012/0004875 A1* | 1/2012 | Maeda .................. H01M 10/48 702/63 |
| 2014/0236511 A1 | 8/2014 | Kulkarni |
| 2016/0327614 A1 | 11/2016 | Young et al. |

(Continued)

FOREIGN PATENT DOCUMENTS

DE 19917473 A1 10/2000

OTHER PUBLICATIONS

PCT/US2020/043662, The International Search Report and Written Opinion, dated Nov. 13, 2020, 9pgs.

*Primary Examiner* — Jas A Sanghera
(74) *Attorney, Agent, or Firm* — Shumaker & Sieffert, P.A.

(57) ABSTRACT

In some examples, a host device includes a battery capacity and/or battery resistance predictive model. The host device may predict a battery capacity value and/or batter resistance value of a rechargeable battery and compare the predicted battery capacity and/or predicted battery resistance to a battery capacity value and/or battery resistance value stored in a fuel gauge. The host device may overwrite the battery capacity value and/or battery resistance value stored in the fuel gauge with the predicted battery capacity value and/or the predicted battery resistance value if the difference is greater than a maximum error threshold.

20 Claims, 4 Drawing Sheets

(56) References Cited

U.S. PATENT DOCUMENTS

2018/0321323 A1 11/2018 Dubarry et al.
2019/0036356 A1* 1/2019 Subbaraman ......... H02J 7/0021
2019/0176639 A1 6/2019 Kumar et al.

* cited by examiner

MODEL-BASED CAPACITY AND RESISTANCE CORRECTION FOR RECHARGEABLE BATTERY FUEL GAUGING

TECHNICAL FIELD

The disclosure relates to batteries and, more particularly, to correcting capacity and resistance values for rechargeable batteries.

BACKGROUND

Many devices, including implantable medical devices, laptop computers, tablets, and cellular phones, among others, utilize rechargeable batteries. These devices also typically include a battery management system that provides a user of the device with a representation of the state of the battery, such as how fully charged the battery may be.

SUMMARY

In some aspects, the disclosure is directed to host devices that utilize rechargeable batteries, such as implantable medical devices, laptop computers, tablets or cellular phones, for example.

In one example, the disclosure is directed to a host device including a memory, and one or more processors coupled to the memory, the one or more processors being configured to: predict at least one of a battery capacity value or a battery resistance value of a rechargeable battery at a time, the rechargeable battery powering the host device; calculate a difference between the at least one of the predicted battery capacity value or the predicted battery resistance value and at least one of a battery capacity value or a battery resistance value stored in memory of a fuel gauge; determine whether the difference exceeds a predetermined maximum error threshold; and based on the difference exceeding the predetermined maximum error threshold, replace, in the memory of the fuel gauge, the at least one of the stored battery capacity value or the battery resistance value with the at least one of the predicted battery capacity value or the predicted battery resistance value.

In another example, the disclosure is directed to method including predicting, by a host device, at least one of a battery capacity or a battery resistance value of a rechargeable battery at a time, the rechargeable battery powering the host device; calculating, by the host device, a difference between the at least one of the predicted battery capacity value or the predicted battery resistance value and at least one of a battery capacity value or a battery resistance value stored in memory of a fuel gauge; determining, by the host device, whether the difference exceeds a predetermined maximum error threshold; and based on the difference exceeding the predetermined maximum error threshold, replacing, by the host device, in the memory of the fuel gauge, the at least one stored battery capacity value or the battery resistance value with the at least one of the predicted battery capacity value or the predicted battery resistance value.

In another example, the disclosure is directed to a non-transitory storage medium comprising instructions that when executed by one or more processors cause the one or more processors to: predict at least one of a battery capacity value or a battery resistance value of a rechargeable battery at a time, the rechargeable battery powering a host device; calculate a difference between the at least one of the predicted battery capacity value or the predicted battery resistance value and a battery capacity value or a battery resistance value stored in memory of a fuel gauge; determine whether the difference exceeds a predetermined maximum error threshold; and based on the difference exceeding the predetermined maximum error threshold, replacing, in the memory of the fuel gauge, the at least one of the stored battery capacity value or the battery resistance value with the at least one of the predicted battery capacity value or the predicted battery resistance value.

The details of one or more examples of the disclosure are set forth in the accompanying drawings and the description below. Other features, objects, and advantages of the disclosure will be apparent from the description and drawings, and from the claims.

DETAILED DESCRIPTION

A variety of devices may utilize rechargeable batteries as a power source for operational power. For example, an implantable medical device (IMD) that provides cardiac rhythm management therapy to a patient, monitors one or more physiological parameters of the patient, or provides neurostimulation therapy to the patient may include a rechargeable battery to supply power for the generation of electrical therapy or other functions of the IMD. As another example, a left-ventricular assist device (LVAD) may include a rechargeable battery to supply power for a pump and other functions of the LVAD. Rechargeable batteries typically have an integrated circuit, such as a fuel gauge, that monitors the battery and provides information regarding the state of the battery to a host device, such as an IMD, a laptop computer, a tablet or a cellular phone. Such information may be a level of charge, for example. The fuel gauge may have a battery capacity value and/or a battery resistance value stored in memory that may have been placed there before it was deployed. These values may be used by the fuel gauge in a battery management system to present to the user of the host device information regarding the state of the battery. However, over time, rechargeable batteries' charge capacity drops and internal resistance increases. So as a battery ages, the stored values in memory of the fuel gauge may become erroneous. In some instances, such as the lack of deep cycle or continuous cycling without rest, the battery management system may not be able to update the initial battery capacity value or battery resistance value. If the stored battery capacity value or battery resistance value becomes erroneous, the information presented to the user regarding the state of the battery may also become erroneous. For example, the battery management system may overestimate the remaining capacity of the battery. If the user of the host device relies upon the information provided to them, the user may find that the battery runs out of power before they believe it should.

Figure 1:
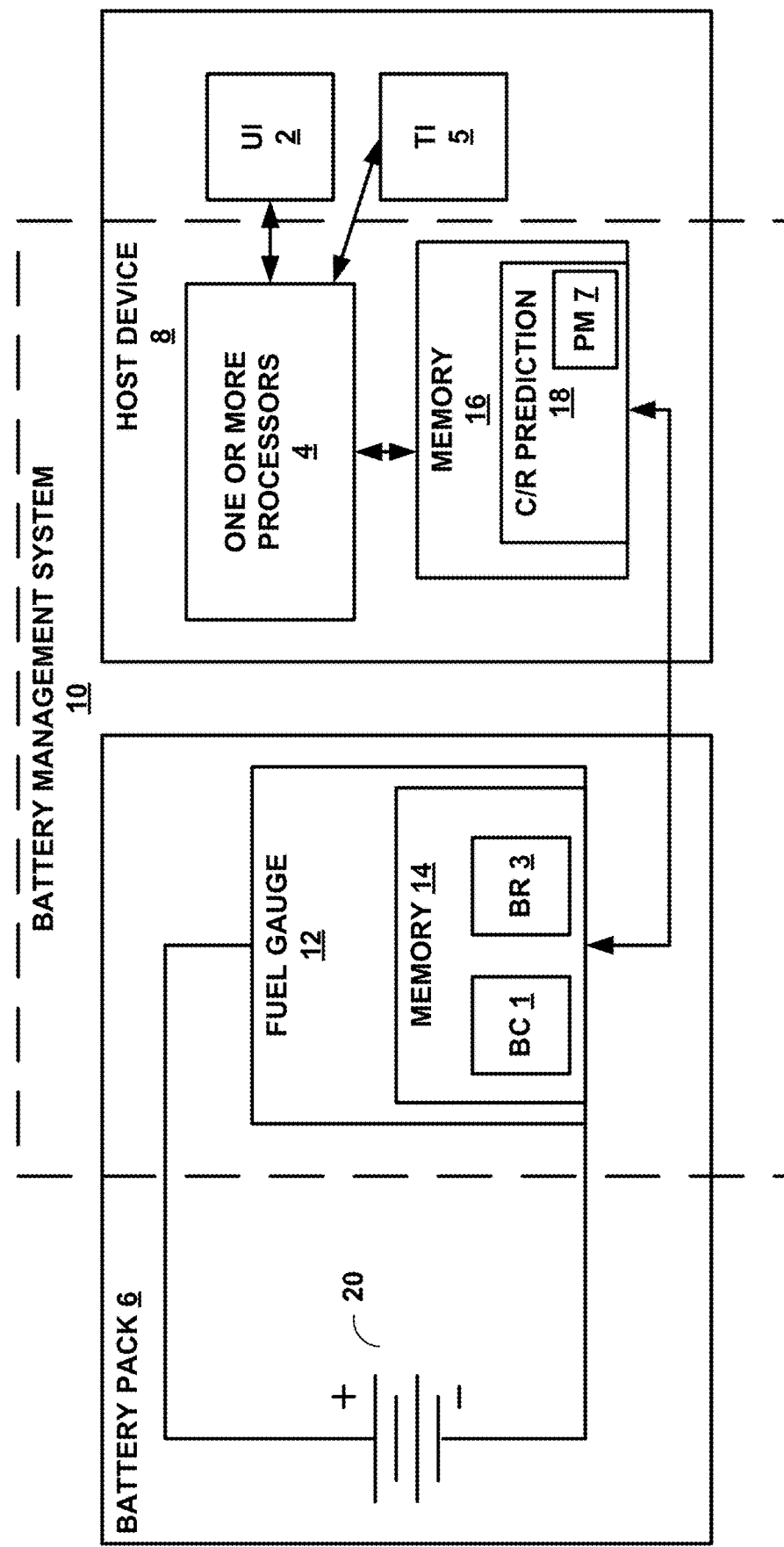
FIG. 1 is a block diagram of battery management system according to techniques of this disclosure.

FIG. 1 is a block diagram of a battery management system according to the techniques of this disclosure. FIG. 1 depicts a host device 8, which may be an IMD, another medical device, a laptop computer, a tablet, a cellular phone or any other device that utilizes a rechargeable battery to power its operations. Host device 8 includes memory 16 that includes a battery capacity and/or battery resistance prediction algorithm 18. Battery capacity and/or battery resistance prediction algorithm may contain a predictive model 7 of change in battery capacity and/or battery resistance over time. Battery capacity and/or battery resistance prediction algorithm 18 may be implemented in higher-level firmware. In some examples, battery capacity and/or battery resistance prediction algorithm 18 may be implemented in software rather than firmware.

Host device 8 also includes one or more processors 4 configured to execute battery capacity and/or battery resistance prediction algorithm 18. One or more processors 4 may be implemented as one or more digital signal processors (DSPs), general purpose microprocessors, application specific integrated circuits (ASICs), field programmable logic arrays (FPGAs), or other equivalent integrated or discrete logic circuitry. Host device 8 may further include user interface 2. User interface 2 may enable a user to provide information to host device 8 and receive information from host device 8. For example, user interface 2 may provide a visual indication of the state of the battery charge that a fuel gauge believes the battery has remaining to the user of host device 8. Host device 8 may also contain telemetry interface 5. Telemetry interface 5 may enable host device 8 to communicate with other devices. For example, telemetry interface may enable communications utilizing any standardized or proprietary communications protocols, be they wired or wireless. In some examples, when host device 8 is an IMD, host device 8 may communicate the indication of the state of the battery charge to an external device (not shown) through the telemetry interface 5 and the external device may provide that information to the user of host device 8.

FIG. 1 also depicts a battery pack 6. Battery pack 6 includes a fuel gauge 12 and a battery 20. Fuel gauge 12 may be an integrated circuit and may be collocated with battery 20 in battery pack 6. Fuel gauge 12 may include memory 14. Memory 14 may store values associated with battery 20. For example, memory 14 may store a battery capacity value 1 and a battery resistance value 3. Battery capacity value 1 and battery resistance value 3 may be stored in memory 14 prior to battery pack 6 being deployed. Battery capacity value 1 and battery resistance value 3 may be utilized by fuel gauge 12 to provide information to host device 8 (and thereby to a user of host device 8) regarding the state of the charge of battery 20. Fuel gauge 12 may monitor battery 20 and estimate battery 20's remaining capacity, state-of-charge, or other state parameters based on battery capacity, battery resistance, load current, temperature and other parameters stored in memory 14. One or more processors 4 executing battery capacity and/or battery resistance prediction algorithm 18 of host device 8 may regularly communicate with fuel gauge 12 to retrieve various battery state parameters and provide information regarding the battery state parameters to a user of host device 8. For example, one or more processors 4 executing battery capacity and/or battery resistance prediction algorithm 18 may receive battery state parameters, such as battery capacity 1 or battery resistance 3, from fuel gauge 12 and provide information regarding the battery state parameters to the user of host device 8 through user interface 2 or telemetry interface 5. While shown as part of battery management system 10, one or more processors 4 may also be configured to perform other tasks as well.

Figure 2:
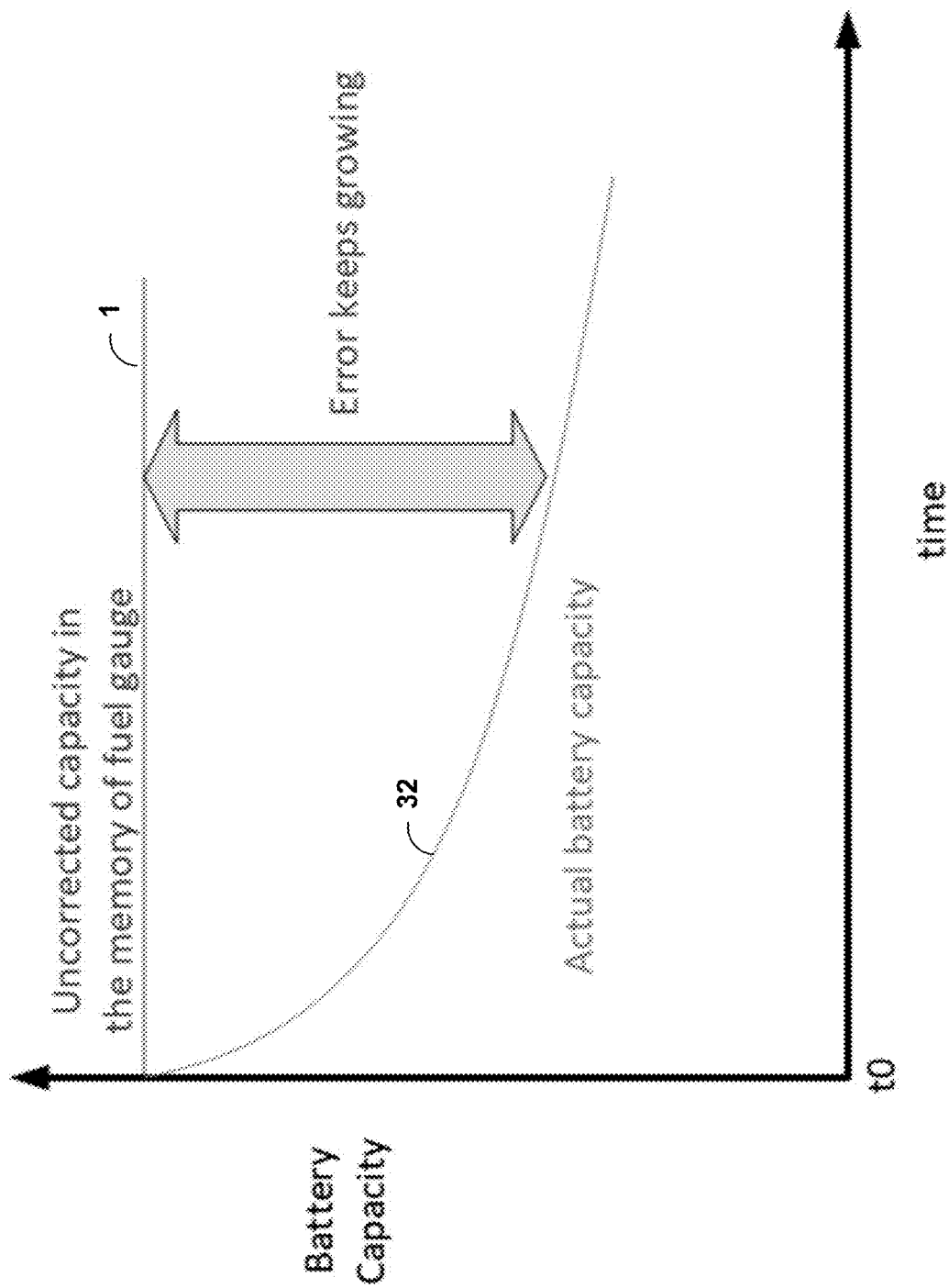
FIG. 2 is a graph illustrating the change in battery capacity over time.

FIG. 2 is a graph illustrating a change in battery capacity over time. Battery capacity value 1 represents the battery capacity value stored in memory 14. Curve 32 represents the actual battery capacity of battery 20 as battery 20 ages. As can be seen, the difference between battery capacity value 1 and curve 32 keeps growing over time. So the older battery 20 becomes, the more erroneous information host device 8 receives from fuel gauge 12 may become. While not depicted in FIG. 2, actual battery resistance also changes as battery 20 ages. Actual battery resistance increases as battery 20 ages. If battery resistance value 3 does not change, the older battery 20 becomes, the more erroneous information host device 8 receives from fuel gauge 12 may become as well.

Figure 3:
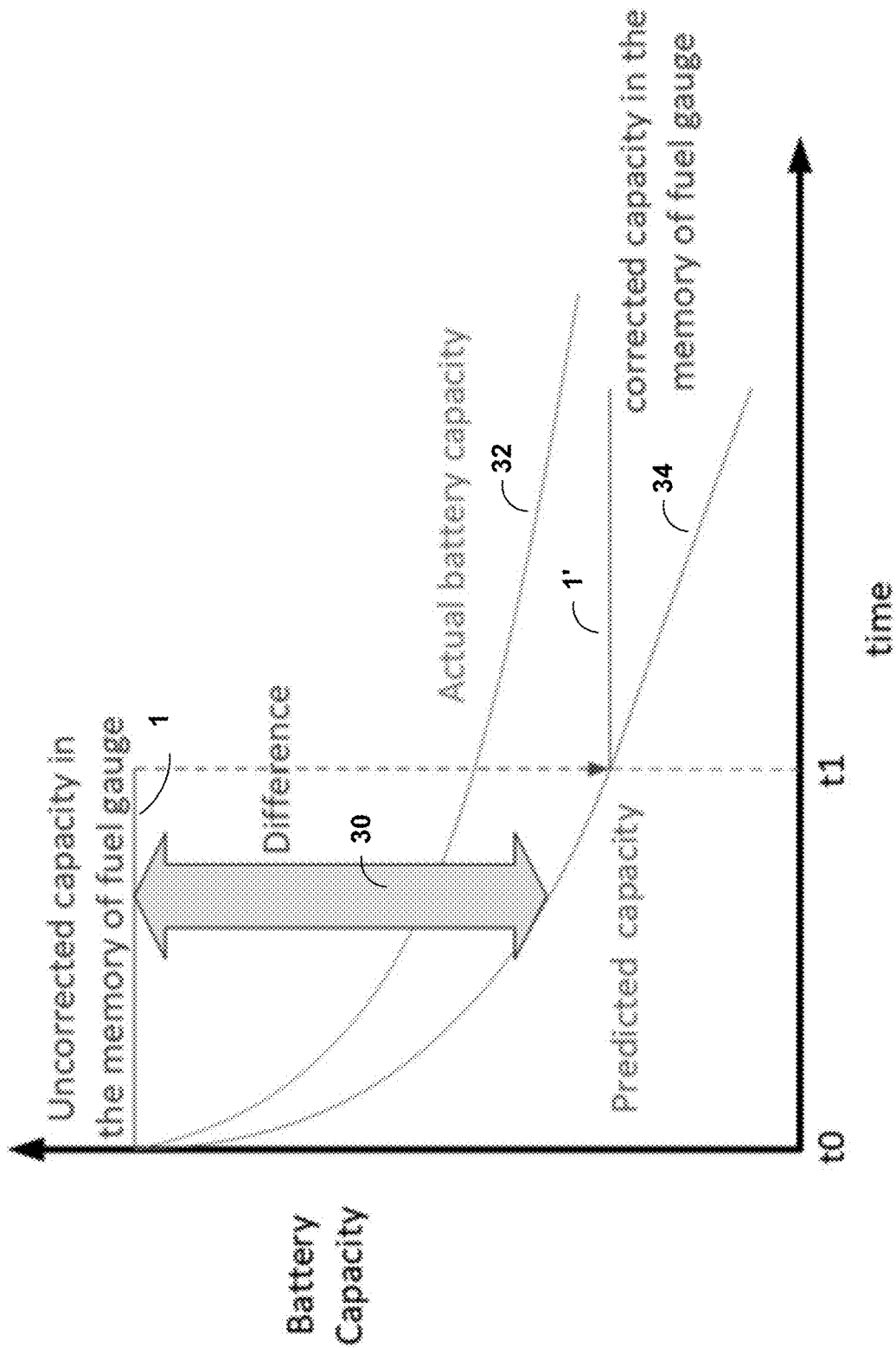
FIG. 3 is a graph illustrating changing the predicted battery capacity according to techniques of this disclosure.

FIG. 3 is a graph illustrating changing the predicted battery capacity according to techniques of this disclosure. Battery capacity value 1 again represents the battery capacity value stored in memory 14. The actual battery capacity is again represented by curve 32. The battery capacity and/or battery resistance algorithm 18 may be used by one or more processors 4 of host device 8 to predict the battery capacity or battery resistance of battery 20.

In the example of FIG. 3, the predicted battery capacity is represented by curve 34. The prediction of battery capacity may be based on predictive model 7 of the battery life including capacity fade and resistance growth over time. For example, predictive model 7 may be based upon time and cycle count of the battery. In one example, predictive model 7 may be created through a simulation of a battery used for the same or similar purpose (e.g., an IMD). In another example, predictive model 7 may be based upon information collected from batteries used previously for the same or similar purpose. In yet another example, a battery from the same lot as battery 20 may be tested in a laboratory for the same or similar purpose as battery 20 and information regarding its battery capacity and battery resistance may be provided to host device through telemetry interface 5 periodically. In this example, one or more processors 4 may then update battery capacity and/or battery resistance prediction algorithm 18 based on the test information.

One or more processors 4 of host device 8 may check to determine whether battery capacity value 1 in memory 14 is erroneous and may update battery capacity value 1 to match the predicted capacity. In some examples, one or more processors 4 of host device 8 may receive a flag or signal from fuel gauge 12 indicating that fuel gauge 12 indicating battery capacity value 1 is incorrect. In other examples, one or more processors 4 of host device 8 may determine whether battery capacity value 1 is incorrect on a periodic basis. The periodic basis may be a fixed period of time or may be event driven, such as checking each time after recharging or after powering up.

For example, at time t1, one or more processors 4 may compare a difference between battery capacity value 1 and the predicted battery capacity 34. If the difference between battery capacity value 1 and the predicted battery capacity 34 at time t1 is greater than a predetermined maximum error threshold, such as predetermined maximum error threshold 30, one or more processors 4 of host device 8 may write the predicted battery capacity 34 at time t1 into memory 14 replacing battery capacity value 1 with battery capacity value 1'. While predetermined maximum error threshold is portrayed in a specific fashion in FIG. 3, it should not be considered limiting. For example, the predetermined maximum error threshold may be larger or smaller than depicted.

In some examples, the predetermined maximum error threshold may be in the range of 3% of the initial (t0) battery capacity value or a previously updated battery capacity value. In this manner, information provided by fuel gauge 12 to host device 8 may be more accurate and any overestimation of the remaining capacity of the battery may be less.

While the example of FIG. 3 is directed to battery capacity values, the same process may be used with respect to battery resistance value 3 or other battery parameters stored in memory 14. For example, one or more processors 4 of host device 8 may determine that battery resistance value 3 in memory 14 is erroneous and may update that value to match a predicted battery resistance. For example, at time t1, one or more processors 4 may compare a difference between battery resistance value 3 and the predicted battery resistance value. If the difference between battery resistance value 3 and the predicted battery resistance value at time t1 is greater than a predetermined maximum error threshold, one or more processors 4 of host device 8 may write the predicted battery resistance value at time t1 into memory 14 replacing battery resistance value 3 with battery resistance value 3' (not shown). In some examples, the predetermined maximum error threshold may be in the range of 3% of the initial (t0) battery resistance value or a previously updated battery resistance value.

Figure 4:
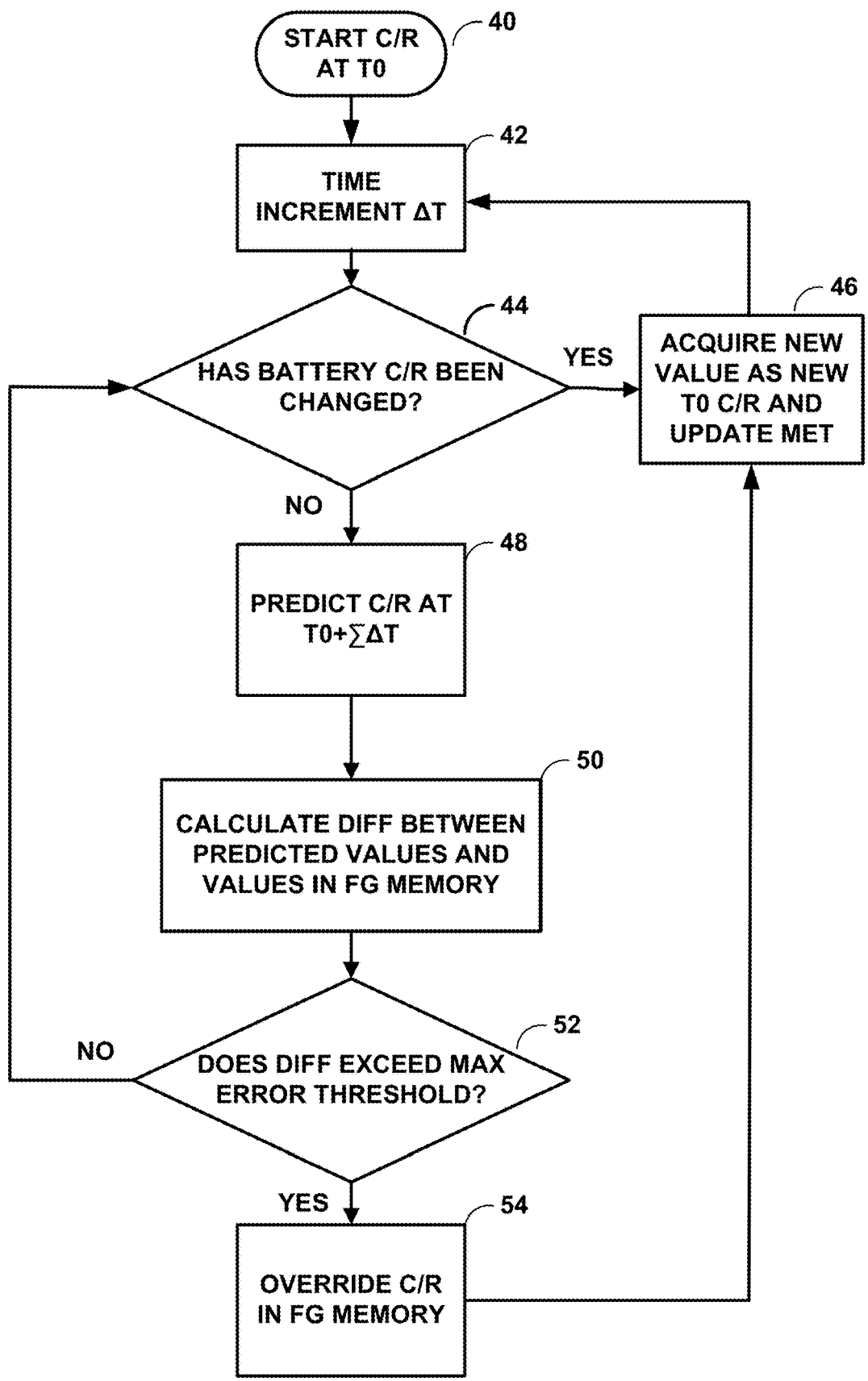
FIG. 4 is a flow diagram illustrating techniques for changing the predicted battery capacity or battery resistance in a battery management system according to techniques of this disclosure.

FIG. 4 is a flow diagram illustrating techniques for changing the predicted battery capacity or battery resistance in a battery management system according to techniques of this disclosure. Fuel gauge 12 may have initial parameters, such as battery capacity value 1 and battery resistance value 3 stored in memory 14 (40). One or more processors 4 may execute battery capacity and/or battery resistance prediction algorithm 18 at a predetermine time interval. At the predetermined time interval, for example, one week, one or more processors 4 may increment a stored time (42). In some examples, such as where the battery is operated in a high temperature environment, the predetermined time interval may be shorter so that the one or more processors 4 execute battery capacity and/or battery resistance prediction algorithm 18 more frequently. The stored time may be stored in memory 16 and may be part of battery capacity and/or battery resistance prediction algorithm 18. Alternatively, the stored time may stored in memory 14 of fuel gauge 12. One or more processors 4 may then determine whether battery capacity value 1 and/or battery resistance value 3 stored in memory 14 have been changed (44) by something other than the battery capacity and/or battery resistance prediction algorithm 18. If the battery capacity value 1 and/or battery resistance value 3 have been changed (the "YES" path from decision diamond 44), one or more processors 4 acquire predicted battery capacity value 1' and/or predicted battery resistance value 3' as new initial values and update the maximum error threshold based upon the new values (46). For example, the battery capacity value 1 and/or battery resistance value 3 may have been changed by fuel gauge 12 itself, if certain conditions are met, such as a deep cycle. If battery capacity value 1 and/or battery resistance value 3 have not been changed (the "NO" path from decision diamond 44), one or more processors 4 may predict a battery capacity or battery resistance at that time (e.g., t1) utilizing battery capacity and/or battery resistance prediction algorithm 18 (48). As discussed above, the prediction of battery capacity or battery resistance may be based on predictive model 7 of the battery life including capacity fade and resistance growth over time.

One or more processors 4 may calculate a difference between battery capacity value 1 and/or battery resistance value 3 stored in memory 14 and the predicted battery capacity value and/or the predicted battery resistance value (50). One or more processors 4 may then compare the difference to maximum error threshold 30 (52). If the difference is greater than maximum error threshold 30 (the "YES" path from decision diamond 52), one or more processors 4 may override battery capacity value 1 or battery resistance value 3 in memory 14 of fuel gauge 12 by writing the predicted battery capacity value 1' or predicted battery resistance value 3' (not shown) over battery capacity value 1 or battery resistance value 3 (52). Predicted battery capacity value 1' or predicted battery resistance value 3' (not shown) may then be used as new initial values at time t0 and update the maximum error threshold based on the new initial values (46). If the difference does not exceed the maximum error threshold (the "NO" path from decision diamond 52), one or more processors 4 may return to decision diamond 44 to determine if the values stored in memory 14 have been changed.

Host device 8 may include electronics and other internal components necessary or desirable for executing the functions associated with the device. In one example, host device 8 includes one or more of processing circuitry, memory, a signal generation circuitry, sensing circuitry, telemetry circuitry, and a power source. In general, memory of host device 8 may include computer-readable instructions that, when executed by a processor of host device 8, cause it to perform various functions attributed to the device herein.

Host device 8 may include or may be one or more processors or processing circuitry, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" and "processing circuitry" as used herein may refer to any of the foregoing structure or any other structure suitable for implementation of the techniques described herein.

Memory may include any volatile or non-volatile media, such as a random-access memory (RAM), read only memory (ROM), non-volatile RAM (NVRAM), electrically erasable programmable ROM (EEPROM), flash memory, and the like. Memory may be a storage device or other non-transitory medium.

Various examples have been described in the disclosure. These and other examples are within the scope of the following claims.

The invention claimed is:

1. A host device comprising:
    a memory; and
    one or more processors coupled to the memory, the one or more processors being configured to:
        predict at least one of a battery capacity value or a battery resistance value of a rechargeable battery at a time, the rechargeable battery powering the host device;
        calculate a difference between the at least one of the predicted battery capacity value or the predicted battery resistance value and at least one of a battery capacity value or a battery resistance value stored in memory of a fuel gauge;
        determine whether the difference exceeds a predetermined maximum error threshold; and
        based on the difference exceeding the predetermined maximum error threshold, replace, in the memory of the fuel gauge, the at least one of the stored battery capacity value or the battery resistance value with the at least one of the predicted battery capacity value or the predicted battery resistance value.

2. The host device of claim 1, wherein the fuel gauge is collocated with the rechargeable battery.

3. The host device of claim 1, wherein the fuel gauge provides the one or more processors with a representation of a level of charge of the rechargeable battery.

4. The host device of claim 1, further comprising a predictive model of battery capacity or battery resistance.

5. The host device of claim 4, wherein the predictive model models a change in battery capacity or battery resistance over time.

6. The host device of claim 4, wherein the predictive model is implemented in firmware.

7. The host device of claim 6, further comprising an implantable medical device.

8. The host device of claim 4, wherein the one or more processors are further configured to determine whether the at least one of the battery capacity value or the battery resistance value stored in the memory have been changed.

9. The host device of claim 8, wherein the one or more processors are further configured to update the maximum error threshold in response to determining that the at least one of the battery capacity value or the battery resistance value stored in memory have been changed.

10. A method comprising:
predicting, by a host device, at least one of a battery capacity or a battery resistance value of a rechargeable battery at a time, the rechargeable battery powering the host device;
calculating, by the host device, a difference between the at least one of the predicted battery capacity value or the predicted battery resistance value and at least one of a battery capacity value or a battery resistance value stored in memory of a fuel gauge;
determining, by the host device, whether the difference exceeds a predetermined maximum error threshold; and
based on the difference exceeding the predetermined maximum error threshold, replacing, by the host device, in the memory of the fuel gauge, the at least one stored battery capacity value or the battery resistance value with the at least one of the predicted battery capacity value or the predicted battery resistance value.

11. The method of claim 10, wherein the fuel gauge is collocated with the rechargeable battery.

12. The method of claim 10, further comprising providing, by the fuel gauge to one or more processors, a representation of a level of charge of the rechargeable battery.

13. The method of claim 10, wherein the predicting is based upon a predictive model of battery capacity or battery resistance.

14. The method of claim 13, wherein the predictive model models a change in battery capacity or battery resistance over time.

15. The method of claim 13, wherein the predictive model is implemented in firmware on the host device.

16. The method of claim 15, wherein the host device is an implantable medical device.

17. The method of claim 13, further comprising determining whether the at least one of the battery capacity value or the battery resistance value stored in the memory of the fuel gauge have been changed.

18. The method of claim 17, further comprising updating the maximum error threshold in response to determining that the at least one of the battery capacity value or the battery resistance value stored in memory have been changed.

19. A non-transitory storage medium comprising instructions that when executed by one or more processors cause the one or more processors to:
predict at least one of a battery capacity value or a battery resistance value of a rechargeable battery at a time, the rechargeable battery powering a host device;
calculate a difference between the at least one of the predicted battery capacity value or the predicted battery resistance value and a battery capacity value or a battery resistance value stored in memory of a fuel gauge;
determine whether the difference exceeds a predetermined maximum error threshold; and
based on the difference exceeding the predetermined maximum error threshold, replacing, in the memory of the fuel gauge, the at least one of the stored battery capacity value or the battery resistance value with the at least one of the predicted battery capacity value or the predicted battery resistance value.

20. The non-transitory storage medium of claim 19, wherein the host device is an implantable medical device.

* * * * *